(12) United States Patent
Jo et al.

(10) Patent No.: US 10,897,010 B2
(45) Date of Patent: Jan. 19, 2021

(54) MASK FRAME ASSEMBLY FOR THIN LAYER DEPOSITION

(71) Applicant: Samsung Display Co., Ltd., Yongin-si (KR)

(72) Inventors: Junho Jo, Yongin-si (KR); Euigyu Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/854,661

(22) Filed: Dec. 26, 2017

(65) Prior Publication Data

US 2018/0138409 A1 May 17, 2018

Related U.S. Application Data

(62) Division of application No. 15/180,921, filed on Jun. 13, 2016, now Pat. No. 9,882,129.

(30) Foreign Application Priority Data

Nov. 6, 2015 (KR) ........................ 10-2015-0155789

(51) Int. Cl.
*H01L 51/00* (2006.01)
*C23C 16/04* (2006.01)
*C23C 14/04* (2006.01)

(52) U.S. Cl.
CPC ........ *H01L 51/0011* (2013.01); *C23C 14/042* (2013.01); *C23C 16/042* (2013.01)

(58) Field of Classification Search
None
See application file for complete search history.

(56) References Cited

U.S. PATENT DOCUMENTS 8,881,676 B2 11/2014 Hong
9,141,001 B2 9/2015 Kim
(Continued)

FOREIGN PATENT DOCUMENTS

KR 10-2009-0110979 10/2009
KR 10-2012-0105295 9/2012
(Continued)

OTHER PUBLICATIONS

Non-Final Office Action dated Jun. 16, 2017, in U.S. Appl. No. 15/180,921.

(Continued)

*Primary Examiner* — Abul Kalam
(74) *Attorney, Agent, or Firm* — H.C. Park & Associates, PLC (57) ABSTRACT

A mask frame assembly manufactured via an extension-welding process on a stage, the mask frame assembly includes: a mask frame disposed on a stage, the mask frame including a first frame and a second frame having a first length, and a third frame and a fourth frame having a second length, the second length less than the first length. The mask frame assembly also includes a mask having respective ends welded and combined onto the first frame and the second frame. The first frame and the second frame include a slot disposed toward the stage, and at least portions of the first frame and the second frame corresponding to the slot are not in contact with the stage. The third frame and the fourth frame and the stage are in contact with the stage.

8 Claims, 8 Drawing Sheets

(56) References Cited

U.S. PATENT DOCUMENTS

| | | |
|---|---|---|
| 2005/0098110 A1 | 5/2005 | Abiko |
| 2009/0137180 A1 | 5/2009 | Sung et al. |
| 2012/0234235 A1* | 9/2012 | Lee ................ C23C 14/042 118/504 |
| 2012/0266813 A1* | 10/2012 | Hong ............... C23C 14/044 118/505 |
| 2012/0279444 A1 | 11/2012 | Hong |
| 2014/0150721 A1 | 6/2014 | Oh et al. |
| 2014/0290574 A1 | 10/2014 | Kim |
| 2015/0027367 A1 | 1/2015 | Hong |
| 2015/0050767 A1 | 2/2015 | Kuriyama et al. |
| 2016/0005970 A1 | 1/2016 | Kwen et al. |
| 2016/0343945 A1 | 11/2016 | Kim et al. |
| 2017/0106391 A1 | 4/2017 | Han |

FOREIGN PATENT DOCUMENTS

| | | |
|---|---|---|
| KR | 10-2012-0120703 | 11/2012 |
| KR | 10-2012-0125035 | 11/2012 |
| KR | 10-1384278 | 4/2014 |
| KR | 10-2014-0118507 | 10/2014 |

OTHER PUBLICATIONS

Corrected Notice of Allowance dated Nov. 16, 2017, in U.S. Appl. No. 15/180,921.

* cited by examiner

MASK FRAME ASSEMBLY FOR THIN LAYER DEPOSITION

CROSS-REFERENCE TO RELATED APPLICATIONS

This application is a Divisional of U.S. patent application Ser. No. 15/180,921, filed on Jun. 13, 2016, and claims priority from and the benefit of Korean Patent Application No. 10-2015-0155789, filed on Nov. 6, 2015, which are hereby incorporated by reference for all purposes as if fully set forth herein.

BACKGROUND

Field

Exemplary embodiments relate to a mask frame assembly for a thin layer deposition, a method of manufacturing the same and a method of manufacturing a display device by using the mask frame assembly.

Discussion of the Background

An organic light emitting display device is an active light emitting type flat display device. In general, the organic light emitting display device has a wide viewing angle, improved contrast, comparably low power consumption, and a thin profile with a light weight and a fast response speed.

A light emitting device may be an inorganic light emitting device and an organic light emitting device, depending on materials included in a light emitting layer. The organic light emitting device has improved luminance characteristics, response speed, etc. than the inorganic light emitting device. Thus, research has been actively made to develop the organic light emitting device.

The organic layers and/or electrodes of an organic light emitting display device may be formed via a vacuum deposition method. As a resolution of organic light emitting display devices gradually increases, a width of an open slit of a mask used in a deposition process decreases, and therefore, a dispersion of deposition material needs to be reduced.

In addition, a shadow effect needs to be reduced or eliminated to manufacture a high resolution organic light emitting display device. Accordingly, the deposition process may be performed with a substrate and the mask adhered to each other, and thus, research has been made to enhance the adherence between the substrate and the mask.

A mask may include a plurality of masks having an elongated stick-like shape or formed as one consolidated mask and welded to a mask frame. In a welding process of the mask to the frame, the mask may be extended along a length direction and welded onto the frame to reduce or prevent a droop phenomenon due to the weight of the mask. After the mask and the frame have been welded, a restoring force may be applied to the mask corresponding to an extension force having been applied to the mask, and thus, shapes of the mask and the mask frame may be changed due to the restoring force.

During the extension-welding process of the mask and the frame, the frame may be arranged on a stage and a certain extension force may be applied to the frame to compensate for the restoring force applied to the mask.

However, the extension force to be applied to the frame to compensate for the restoring force applied to the mask may not be accurately calculated due to a frictional force generated between the stage and the frame during the extension-welding process of the mask.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a mask frame assembly having improved precision, method of manufacturing the same, and method of manufacturing display device by using the same.

Additional aspects will be set forth in part in the description which follows and, in part, will be apparent from the description, or may be learned by practice of the inventive concept.

An exemplary embodiment discloses a mask frame assembly manufactured via an extension-welding process on a stage, the mask frame assembly including: a mask frame disposed on a stage, the mask frame including a first frame and a second frame having a first length, and a third frame and a fourth frame having a second length, the second length less than the first length. The mask frame assembly also includes a mask having respective ends welded and combined onto the first frame and the second frame. The first frame and the second frame include a slot disposed toward the stage, and at least portions of the first frame and the second frame corresponding to the slot are not in contact with the stage. The third frame and the fourth frame and the stage are in contact with the stage.

An exemplary embodiment discloses a method of manufacturing a mask frame assembly, the method including: disposing a mask frame on a stage, the mask frame including a first frame and a second frame having a first length, and a third frame and a fourth frame having a second length, the second length less than the first length; applying a first extension force to the mask by clamping both ends of the mask in a length direction of the mask; applying a second extension force to the first frame and the second frame on which both ends of the mask are disposed, the second extension force having an direction opposite to the first extension force; and welding respective ends of the mask to the first frame and the second frame, wherein the first frame and the second frame include a slot disposed toward the stage, and wherein at least portions of the first frame and the second frame corresponding to the slot not in contact with the stage, and the third frame and the fourth frame and the stage are in contact with the stage.

An exemplary embodiment also discloses a method of manufacturing a display device which includes a first electrode and a second electrode facing each other on a substrate and an organic layer disposed between the first electrode and the second electrode, the method including depositing the organic layer and depositing the second electrode on the organic layer using a mask frame, wherein the mask frame assembly includes mask frame including a first frame and a second frame having a first length, and a third frame and a fourth frame having a second length, the second length less than the first length, and a mask having respective ends welded and combined onto the first frame and the second frame, and wherein the first frame and the second frame include a slot disposed facing away from the mask.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
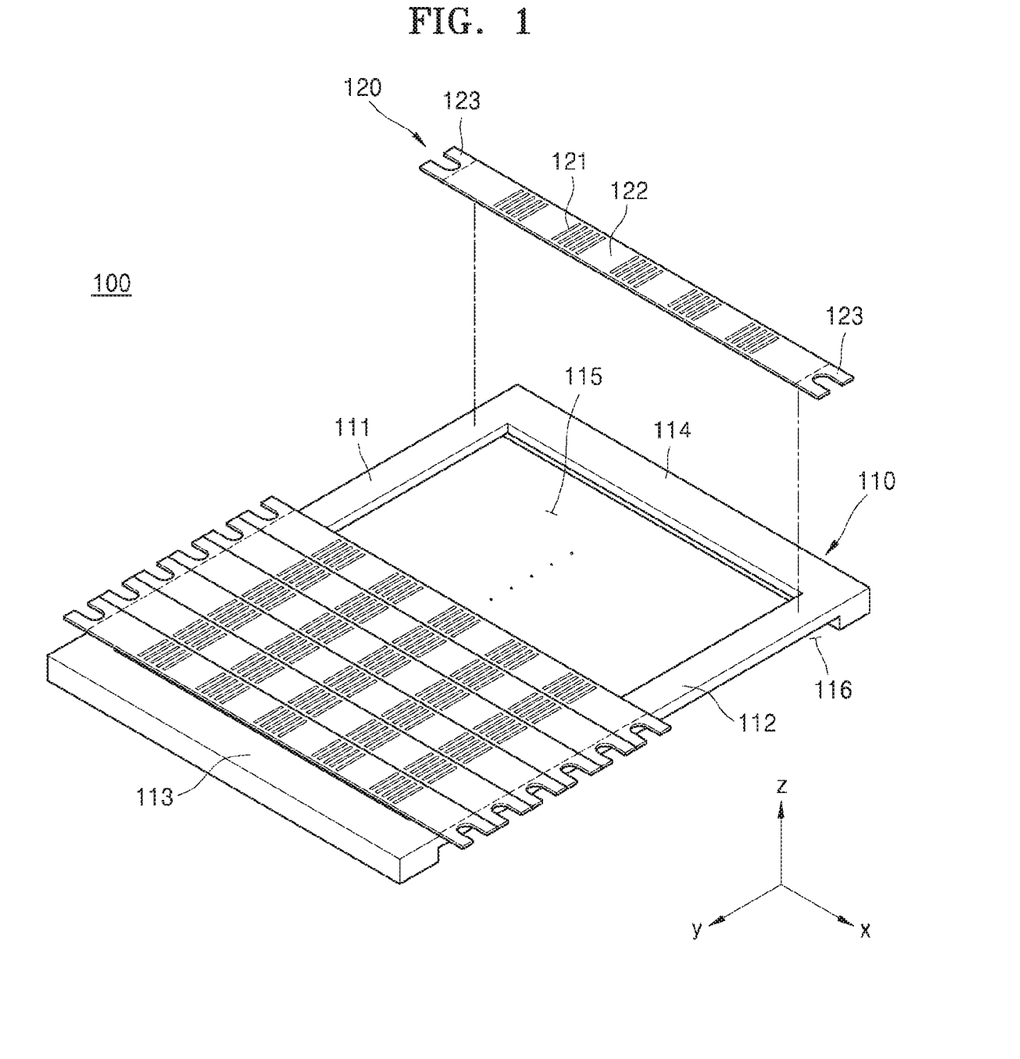
FIG. 1 is a schematic perspective view of a mask frame assembly, according to one or more exemplary embodiments.
Figure 2:
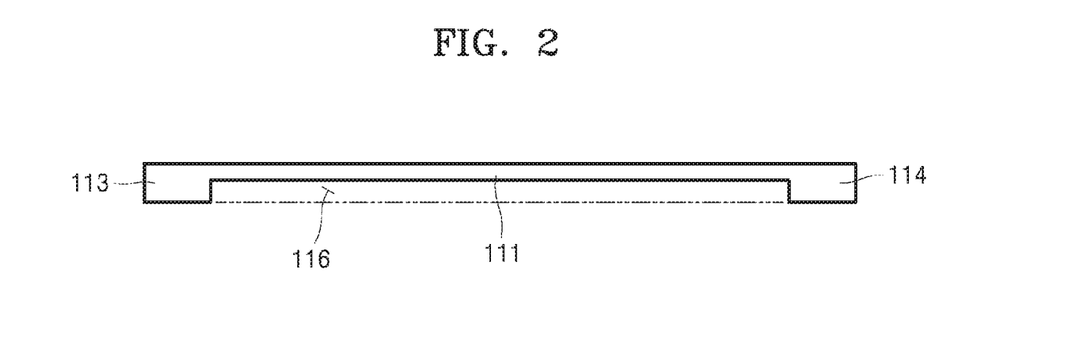
FIG. 2 is a cross-sectional view of a frame in FIG. 1 along a y-axis direction, according to one or more exemplary embodiments.
Figure 3:
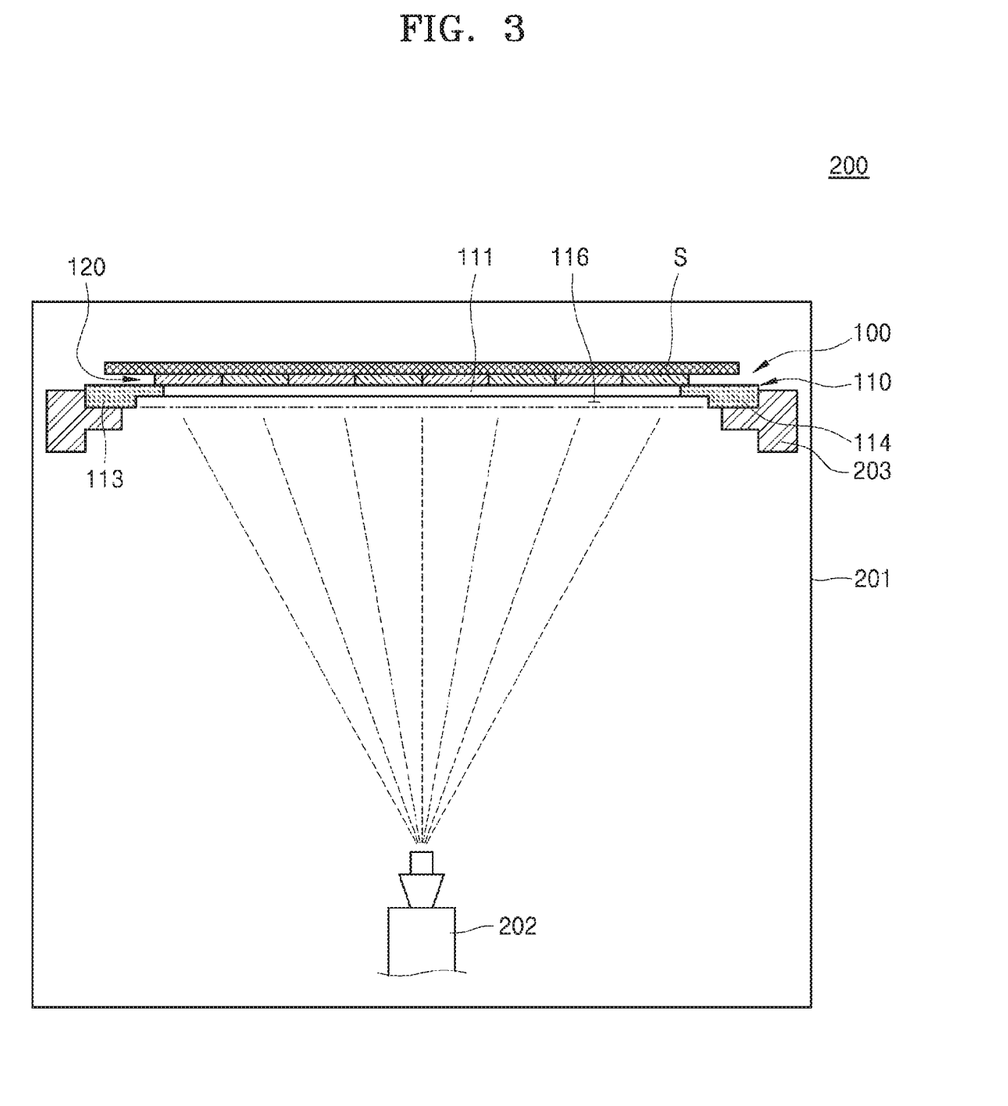
FIG. 3 is a conceptual view of disposing a deposition layer onto a substrate using the mask frame assembly of FIG. 1, according to one or more exemplary embodiments.

FIG. 1 is a schematic perspective view of a mask frame assembly 100 according to one or more exemplary embodiments, FIG. 2 is a cross-sectional view of a frame in FIG. 1 along a y-axis direction, according to one or more exemplary embodiments, and FIG. 3 is a conceptual view of disposing a deposition layer onto a substrate using the mask frame assembly 100 of FIG. 1, according to one or more exemplary embodiments.

Referring to FIGS. 1 and 2, the mask frame assembly 100 may include a mask frame 110 and a plurality of masks 120. The mask frame 110 may include an opening 115 and a plurality of frames including first, second, third, and fourth frames 111, 112, 113, and 114, surrounding the opening 115. The first, second, third, and fourth frames 111, 112, 113, and 114 may be connected with each other.

The mask frame 110 may include the first frame 111 and the second frame 112 disposed facing each other in an x-axis direction, extending along a y-axis direction, and the third frame 113 and the fourth frame 114 disposed facing each other in the y-axis, extending along the x-axis direction.

The first frame 111 and the second frame 112 may each have a first length, and the third frame 113 and the fourth frame 114 may each have a second length, wherein the second length is shorter than the first length. The first frame 111, the second frame 112, the third frame 113 and the fourth frame 114 may be connected with each other to form the mask frame 110 in a rectangular frame shape. The mask frame 110 may include a material that may have reduced deformation during welding of the mask 120, for example, a metal with a high rigidity.

The first frame 111 and the second frame 112 may include a slot 116 toward a stage 50 (refer to FIG. 6) so that at least portions of the first frame 111 and the second frame 112 may not directly contact the stage 50 during an extension-welding process of the mask 120. However, the extension-welding process may be performed while the third frame 113 and the fourth frame 114 directly contact the stage 50.

A slot 116 may be formed in a direction along a length direction of the first frame 111 and the second frame 112 (the y-axis direction) and throughout the entire lengths of the first frame 111 and the second frame 112 facing the stage 50, and an entire portion of the first frame 111 and the second frame 112 may not directly contact the stage 50. An effect of including the slot 116 on the first frame 111 and the second frame 112 will be described in detail below with reference to FIGS. 4, 5, 6, and 7.

The mask 120 may be arranged on the mask frame 110. An adhesion between the mask 120 and a substrate S (refer to FIG. 3) disposed on the mask 120 may be enhanced to reduce a shadow effect for a precise deposition pattern. The mask 120 may be a thin plate made of materials including at least one of stainless steel, invar, nickel (Ni), Cobalt (Co), a nickel alloy, a Ni—Co alloy, etc.

A plurality of masks 120 may be separated from each other in the y-axis direction to prevent or reduce a droop phenomenon due to the weights thereof. The mask 120 may have an elongated stick-like shape (hereinafter, stick shape). The mask 120 may have a width less than a length thereof, but the exemplary embodiments are not limited thereto.

The mask 120 may be separated in a direction along the y-axis, crossing with the extension direction (the x-axis) thereof. In more detail, the plurality of masks 120 may be repeatedly arranged between the third frame 113 and the fourth frame 114, and both ends of each mask 120 may be welded and/or affixed onto the first frame 111 and the second frame 112. The plurality of the masks 120 may cover the opening 115.

The mask 120 may be a stick shape mask divided from the plurality of masks 120, and may include a plurality of pattern holes 121, a rib unit 122 connecting between the plurality of pattern holes 121, and a clamping unit 123 extending from the mask 120 which may be removed after the extension-welding process on the mask 120. A deposition material may be deposited through the plurality of pattern holes 121 onto the substrate S (refer to FIG. 3) and thus, a deposition region on the substrate may be defined.

The mask 120 may be a thin film having magnetic properties, and include nickel or a nickel alloy. The mask 120 may also include a Ni—Co alloy, and the mask 120 may have an improved fine pattern and reduced surface roughness.

According to one or more exemplary embodiments, the mask 120 may be manufactured by using various methods. For example, the mask 120 may be manufactured by using an etching method, including disposing a photoresist layer or a film having a pattern identical onto the plurality of pattern holes 121 onto the thin film, and etching the thin film after attaching the photoresist layer or the film having the pattern of the pattern hole 121 to the thin film. The mask 120 may also be manufactured using electro-forming or electroless plating.

The pattern hole 121 illustrated in the drawing FIGS. 1 and 2 is an exemplary embodiment, but the exemplary embodiments are not limited thereto, and therefore, the pattern hole 121 may have various numbers, arrangements, and shapes. For example, the pattern hole 121 may totally expose the opening or the pattern hole 121 may have a stripe shape.

Referring to FIG. 3, a vacuum chamber 201 may be used in depositing an organic light emitting layer or an electrode of an organic light emitting display device by using the mask frame assembly 100.

A deposition source 202 may be disposed in the lower space within the vacuum chamber 201, and the mask frame assembly 100 may be disposed in the top space within the deposition source 202.

The mask frame assembly 100 may include the plurality of masks 120 illustrated in FIG. 1. The plurality of masks 120 may be disposed on the mask frame 110. The substrate S may be disposed on the plurality of masks 120. A supporting member 203 may be included at edges of the mask frame assembly 100 to affix the mask frame assembly 100. Subsequently, the deposition material may be deposited onto the substrate S.

The mask frame assembly 100 may be affixed or attached onto the supporting member 203, and the substrate S, on which the deposition material is deposited, may be disposed on the mask 120. Next, the deposition material may be sprayed from the deposition source 202 disposed in the lower space within the vacuum chamber 201 toward the mask frame assembly 100, and the deposition material may be deposited onto one surface of the substrate S through the mask 120.

According to one or more exemplary embodiments, improved precision of welding between the mask 120 and the mask frame 110 may improve a precision of a deposition pattern at a desired location on the substrate S. In other words, an adhesion force between the mask frame 110 and the mask 120 may be increased by minimizing or reducing an empty space between the mask frame 110 and the mask 120 in a region where the mask frame 110 and the mask 120 are welded together. After the mask 120 has been welded to the mask frame 110, the deformation of the mask frame 110 or the mask 120 may be minimized or reduced and the deposition material may be deposited onto the substrate S with improved precision. According to one or more exemplary embodiments, the mask frame assembly 100 described in detail below with reference to FIGS. 4, 5, 6, and 7 may have reduced or minimized deformation.

Figure 4:
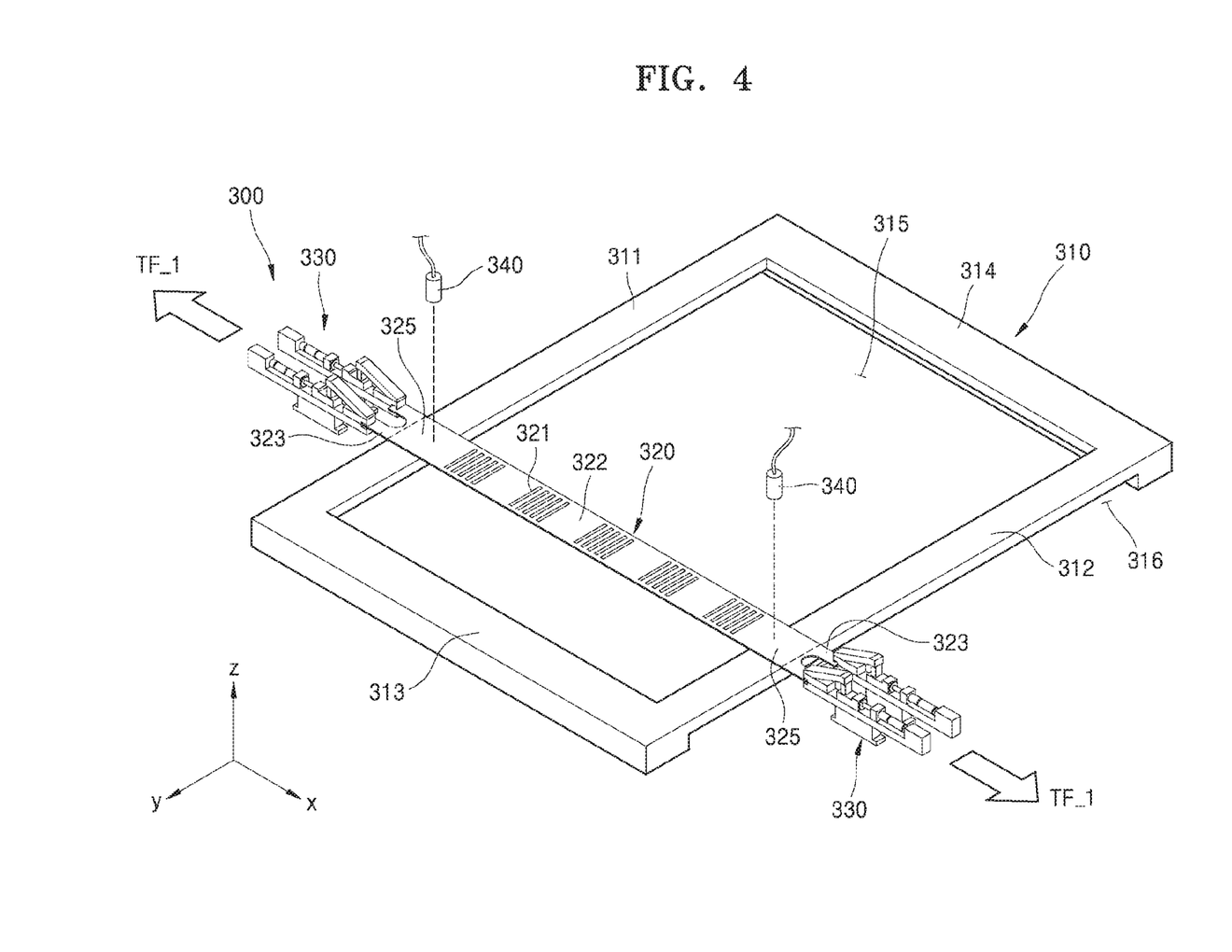
FIG. 4 is a perspective view of a mask extension-welding device to manufacture the mask frame assembly 100 of FIG. 1, according to one or more exemplary embodiments.

FIG. 4 is a perspective view of a mask extension-welding device to manufacture the mask frame assembly 100 of FIG. 1, according to one or more exemplary embodiments.

Referring to FIG. 4, a frame 310 may be a frame having a rectangular shape. The frame 310 may include a first frame 311 and a second frame 312 facing each other in an x-axis direction and extending along a y-axis direction, and a third frame 313 and a fourth frame 314 facing each other in the y-axis and extending along the x-axis direction.

A plurality of masks 320 may be separately arranged in the y-axis direction on the frame 310. The mask 320 may have a width less than a length thereof.

The mask 320 may include a plurality of pattern holes 321 minutely separated from each other. The pattern holes 321 may have a pattern identical with the deposition layer to be deposited onto the substrate. the mask 320 may also include a rib unit 322 between adjacent pattern holes 321. The rib unit 322 may connect the pattern holes 321 together, arranging the pattern holes 321 along the length direction (the x-axis direction) of the mask 320.

According to one or more exemplary embodiments, the frame 310 and the mask 320 may be welded to each other in an area between an outermost deposition pattern unit 325 and a clamping unit 323 of the mask 320.

Both ends of the mask 320 may be extended along the length direction (the x-axis direction) thereof and be welded onto the frame 310. The mask 320 may be extended by extending the clamping units 323 disposed at both ends of the mask 320 and both ends of the mask 320 may be welded onto the first frame 311 and the second frame 312.

According to one or more exemplary embodiments, the mask extension-welding device 300 may be used to weld the mask 320 onto the frame 310. A detailed description thereof is provided below.

The mask extension-welding device 300 may include an extending unit 330, a pressing unit, and a laser welding unit 340.

The mask 320 may be extended along the length direction (the x-axis direction) thereof. The mask 320 may be extended by the extending unit 330. The clamping units 323 may be arranged on the first frame 311 and the second frame 312 while being extended.

Extending units 330 may extend the mask 320 along the length thereof and affix the mask 320 onto the frame 310. The extending units 330 may extend the mask 320 by applying a first tensile force TF_1 to clamping units 323 of the mask 320 using the extending units 330, and the droop phenomenon due to the weight of the mask 320 may be reduced or prevented. By welding the mask 320 onto the frame 310 with the first tensile force TF_1 is applied, a wrinkle and/or the drooping of the mask 320 may be reduced or prevented, and therefore, an amount of the deposition material deposited onto the substrate S via the mask 320 that is deposited outside the deposition region may be reduced or prevented.

According to one or more exemplary embodiments, the extending unit 330 may be mask extending clamps. The extending unit 330 may be clamped to the clamping unit 323 of the mask 320 and extend the mask 320.

The pressing unit may have the mask 320 pressed onto the frame 310. The pressing units may be arranged adjacent to the clamping unit 323 of the mask 320. For example, the pressing unit may be disposed between the outermost pattern hole 321 and the clamping unit 323 of the mask 320.

The pressing unit may press the mask 320 overlapping the frame 310 toward the frame 310. Accordingly, surfaces of the frame 310 and the mask 320 facing each other may be pressed to each other.

The laser welding unit 340 may radiate a laser beam onto an inner surface or an outer surface the mask 320 with respect to a surface where the pressing unit and the clamping unit 323 of the mask 320 contact with each other.

Figure 5:
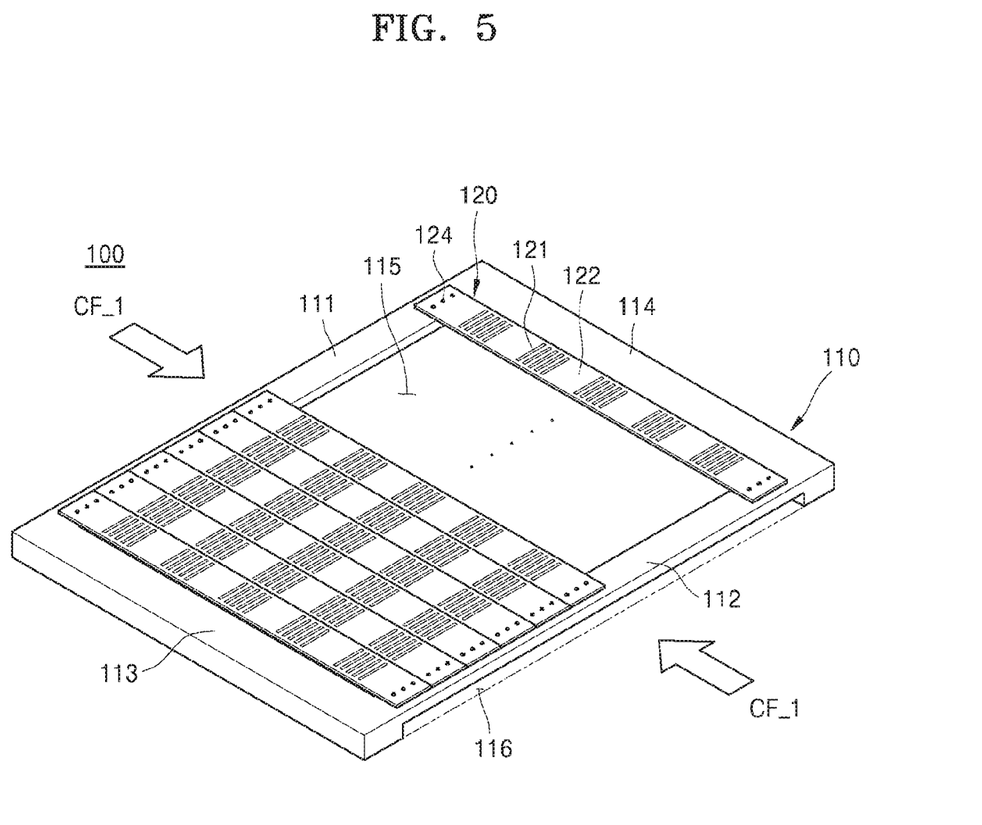
FIG. 5 is a schematic perspective view of the method of manufacturing the mask frame assembly of FIG. 1, according to one or more exemplary embodiments.

FIG. 5 is a schematic perspective view of the method of manufacturing the mask frame assembly 100 of FIG. 1, according to one or more exemplary embodiments.

Referring to FIG. 5, the mask 120 is welded onto the mask frame 110. Respective ends of the mask 120 may be welded onto the first frame 111 and the second frame 112, respectively, via a welded portion 124. Portions of the mask frame 110 and the mask 120 may be melted together by the laser beam radiated from the laser welding unit 340 illustrated in FIG. 4 and be adhered to form the welded portion 124. Referring to FIG. 5, three welded portions 124 are respectively formed at each end of each mask 120. However, the exemplary embodiments are not limited thereto and a plurality of welded portions 124 may be formed.

The mask 120 may be extended and welded onto the mask frame 110. Accordingly, as illustrated in FIG. 5, after the mask frame 110 and the mask 120 have been combined with each other via the welded portion 124, a first restoring force CF_1 may be applied to the mask 120 in an opposite direction with the first tensile force TF_1 illustrated in FIG. 4.

The first restoring force CF_1 may be generated by a restoring force of the mask 120 returning to its original state, which was extended by the first tensile force TF_1 during the extension-welding of the mask 120 after welding. The first restoring force CF_1 may affect the shapes of the mask 120 and the mask frame 110 to which the mask 120 may be welded. A method of compensating for the first restoring force CF_1 will be described in detail with reference to FIGS. 6 and 7.

Figure 6:
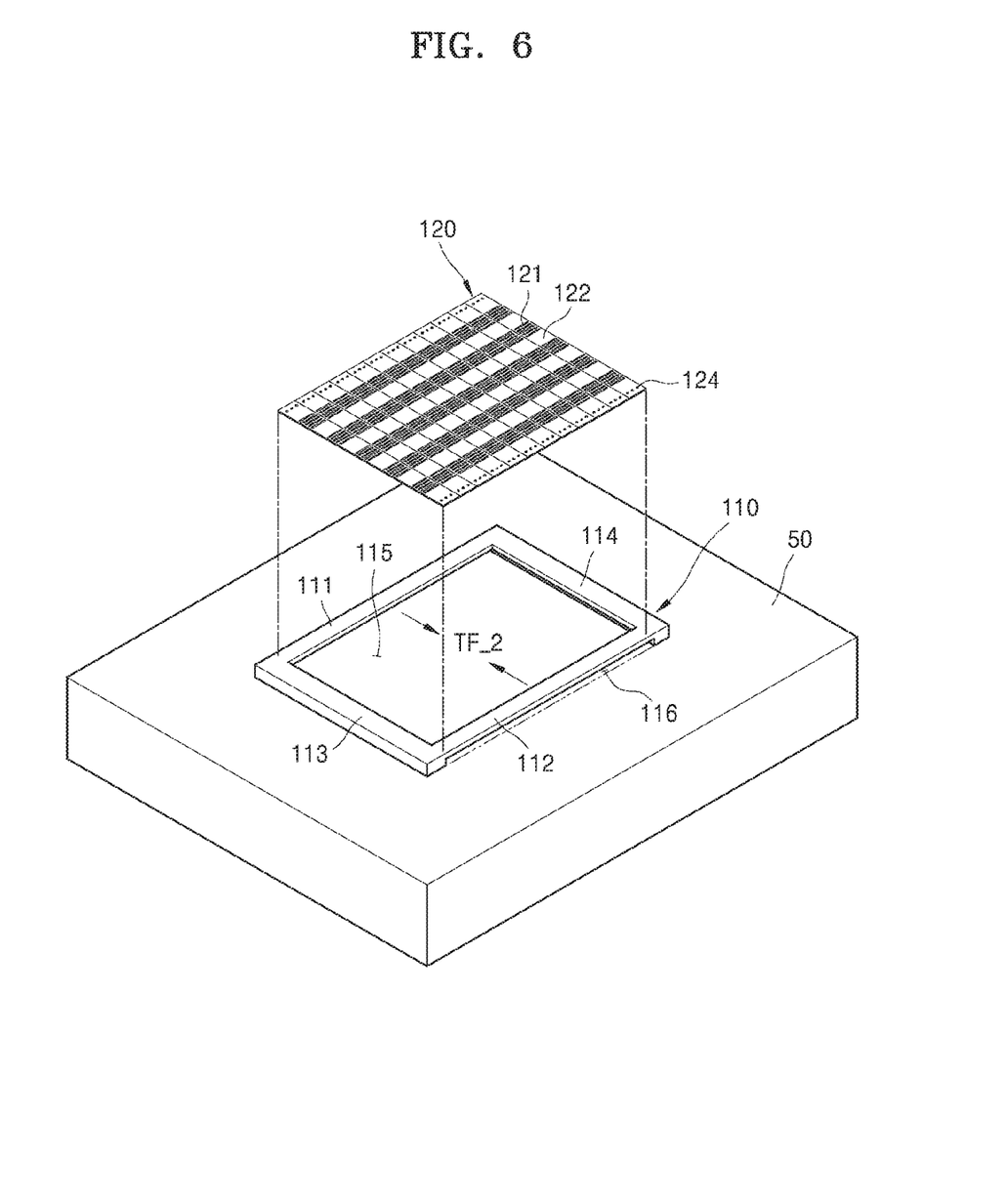
FIG. 6 is a schematic exploded view of the method of manufacturing the mask frame assembly of FIG. 1, according to one or more exemplary embodiments.
Figure 7:
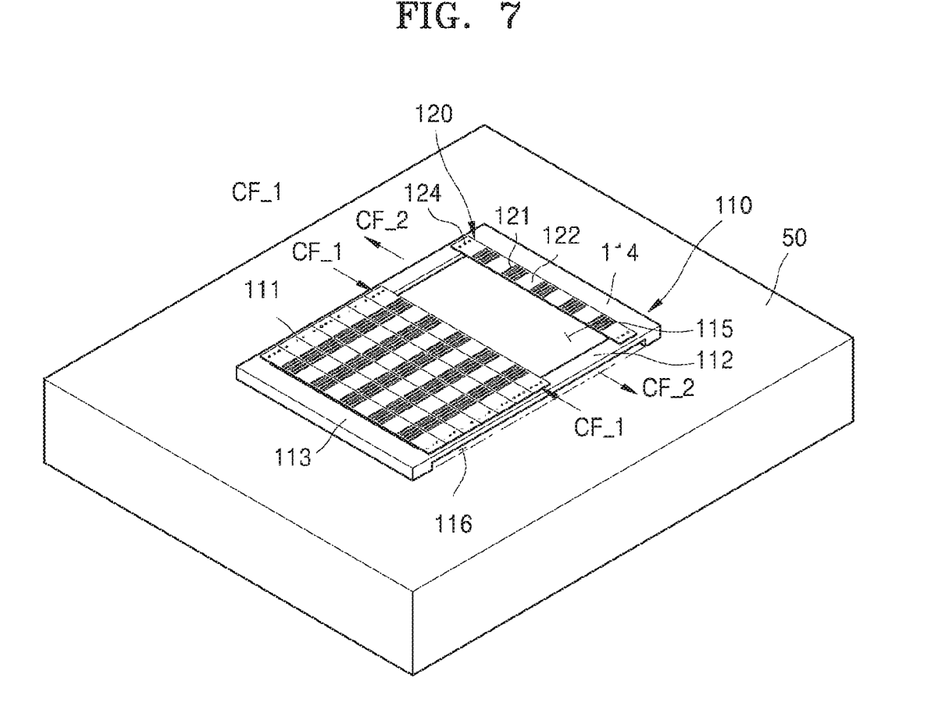
FIG. 7 is a schematic perspective view of the method of manufacturing the mask frame assembly of FIG. 1, according to one or more exemplary embodiments.

FIG. 6 is a schematic exploded view of the method of manufacturing the mask frame assembly 100 of FIG. 1, and FIG. 7 is a schematic perspective view of the method of manufacturing the mask frame assembly 100 of FIG. 1, according to one or more exemplary embodiments.

Referring to FIG. 6, the mask frame 110 may be disposed on the stage 50 to perform the welding process of the mask frame 110 and the mask 120. A second tensile force TF_2 may be applied to the first frame 111 and the second frame 112 to which both ends of the mask 120 may be welded, to compensate for the first restoring force CF_1. The second tensile force TF_2 may be applied in a direction corresponding to that of the first restoring force CF_1 applied to the mask 120 illustrated in FIG. 5.

Referring to FIG. 7, the first restoring force CF_1 may be applied to the mask 120 as illustrated in FIG. 5 after the mask frame 110 has been welded. A second restoring force CF_2 may be applied to the first frame 111 and the second frame 112 in a direction opposite to that of the first restoring force CF_1. The second restoring force CF_2 may be the restoring force with respect to the second tensile force TF_2 applied to the first frame 111 and the second frame 112 during the welding process of the mask frame 110 and the mask 120, similar to the relationship between the first tensile force TF_1 and the first restoring force CF_1.

By applying the second tensile force TF_2 to the first frame 111 and the second frame 112 to compensate for the first restoring force CF_1 applied to the mask 120, the second restoring force CF_2 with respect to the second tensile force TF_2 may be generated in a direction opposite to that of the first restoring force CF_1, and the deformation of the mask frame 110 and the mask 120 due to the first restoring force CF_1 may be reduced or prevented.

The first restoring force CF_1 and the second restoring force CF_2 may not completely cancel out each other for various factors including, for example, a manufacturing yield distribution and a physical property distribution of the mask 120, a quality of the welding, etc., and cause an error in welding simulation of the mask frame 110 and the mask 120. Among the various factors, a friction between the stage 50 and the mask frame 110 may one of the biggest simulation errors.

Accordingly, the slot 116 may be disposed in the first frame 111 and the second frame 112, which may be vulnerable to the deformation due to the tensile force and the restoring force, and reduce the friction force between the stage 50 and the mask frame 110.

The slot 116 may be disposed on a side of the first frame 111 and the second frame 112 that are facing the stage 50. In other words, because of the slot 116, the first frame 111 and the second frame 112 may not be in contact with the stage 50 during the extension-welding process of the mask 120.

The slot 116 may reduce a contact surface between the stage 50 and the first and second frames 111 and 112, the friction force between the stage 50 and the first and second frames 111 and 112 may be reduced, and thus, the tensile forces TF_1 and TF_2 may be more precisely controlled to compensate for the restoring forces CF_1 and CF_2 applied to the mask frame 110 and the mask 120.

Figure 8:
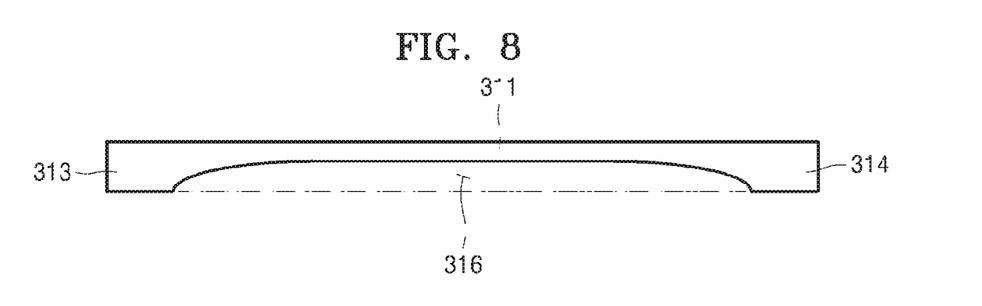
FIG. 8 is a cross-sectional view of a frame in FIG. 2, according to one or more exemplary embodiments.
Figure 9:
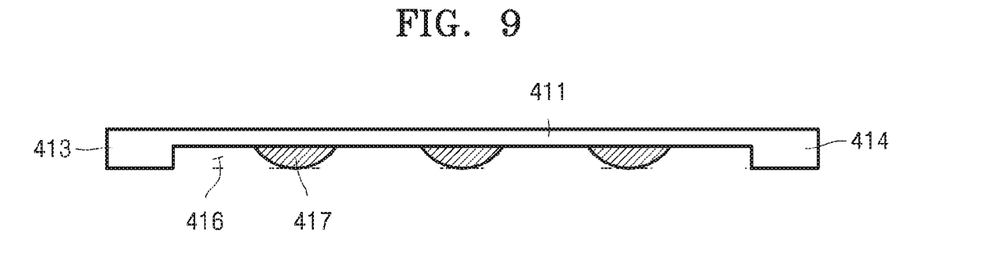
FIG. 9 is a cross-sectional view of a frame in FIG. 2, according to one or more exemplary embodiments.
Figure 10:
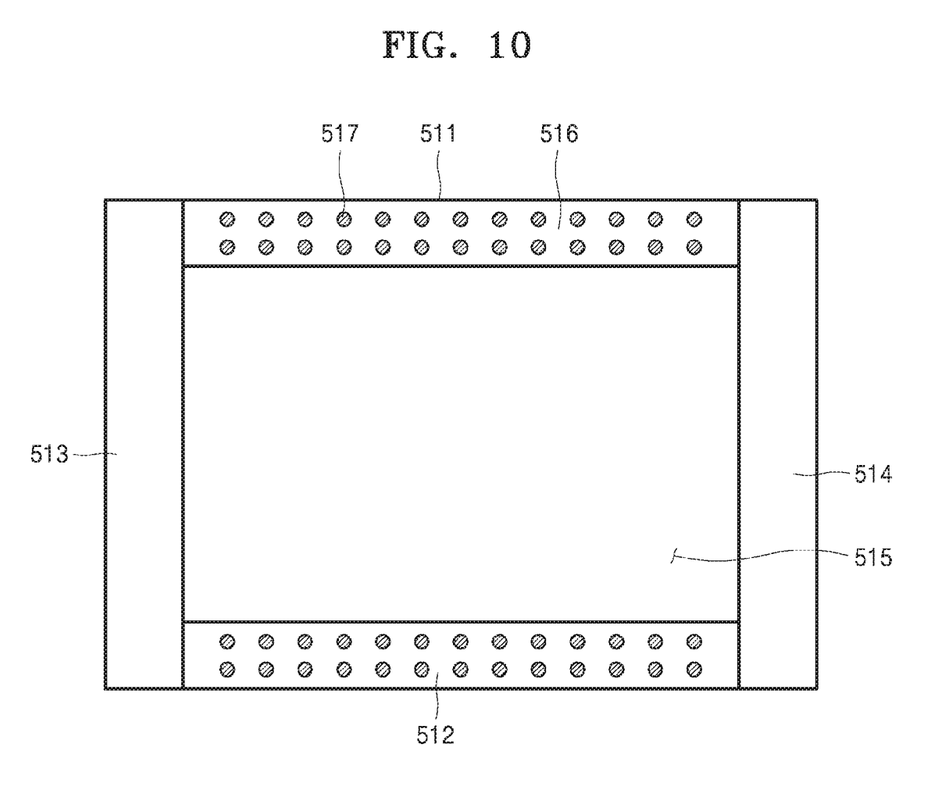
FIG. 10 is a plan view of a frame in FIG. 2, according to one or more exemplary embodiments.

FIG. 8 is a cross-sectional view of a frame in FIG. 2 according to one or more exemplary embodiments, FIG. 9 is a cross-sectional view of a frame in FIG. 2 according to one or more exemplary embodiments, and FIG. 10 is a plan view of a frame in FIG. 2 according to one or more exemplary embodiments.

Referring to FIG. 8, a cross-section of the slot 316 may have an arch shape along the length direction (the y-axis) of the first frame 311 and the second frame 312. The slot 316 having an arch shape may reduce or prevent the droop phenomenon due to the weight of the first frame 311 and the second frame 312.

Referring to FIG. 9, a first frame 411 and a second frame 412 may include a first protruding unit 417 extended along the width direction (the x-axis direction) of the first frame 411 and the second frame 412 and therefore, at least a portion of the first frame 411 and the second frame 412 may be in contact with the stage 50.

A plurality of first protruding units 417 illustrated in FIG. 9 may be arranged along the length direction (the y-axis direction) of the first frame 411 and the second frame 412. FIG. 9 illustrates three first protruding units 417 arranged along the length of the first frame 411. However, the exemplary embodiments are not limited thereto, and one or more of first protruding unit 417 may be arranged under the first frame 411 and the second frame 412. Accordingly, the first protruding unit 417 may be in line-contact with the stage 50 along the width direction (the x-axis direction) of the first frame 411 and the second frame 412.

Referring to FIG. 10, a first frame 511 and a second frame 512 may include a plurality of second protruding units 517 arranged in the length direction (the y-axis direction) and the width direction (the x-axis direction) of the first frame 511 and the second frame 512. Accordingly, the plurality of second protruding units 517 of the first frame 511 and the second frame 512 may be in contact with the stage 50. The second protruding unit 517 may be in point-contact with the stage 50.

Referring to FIG. 10, the second protruding unit 517 has a circular shape. However, the exemplary embodiments are not limited thereto. For example, the second protruding unit 517 may have a shape other than the circular shape, including, but not limited to, an elliptical shape and a polygonal shape. Furthermore, referring to FIG. 10, all of second protruding units 517 have a circular shape. However, the exemplary embodiments are not limited thereto, and the second protruding units 517 having a circular shape, an elliptical shape and/or a polygonal shape may be mixed and arranged under the first frame 511 and the second frame 512.

Figure 11:
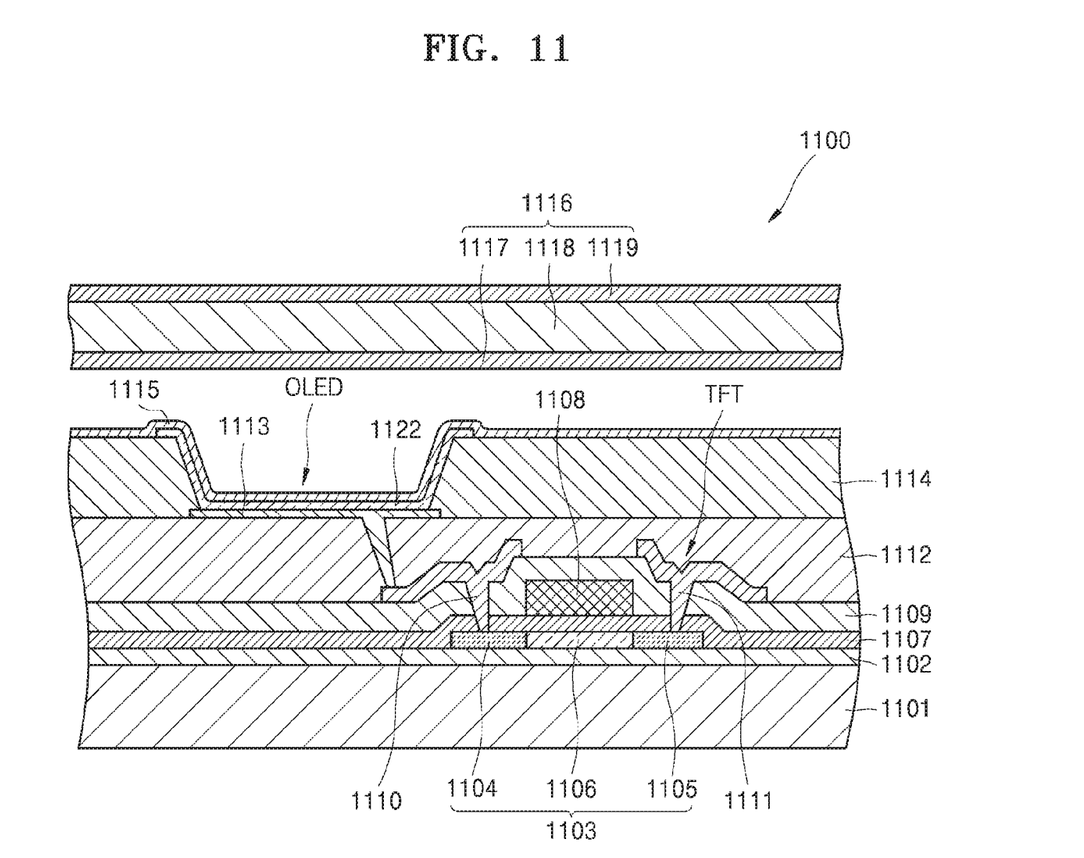
FIG. 11 is a cross-sectional view of one sub-pixel of an organic light emitting device with a light emitting layer manufactured using the device of a display device illustrated in FIG. 3, according to one or more exemplary embodiments.

FIG. 11 is a cross-sectional view of one sub-pixel of an organic light emitting device with a light emitting layer manufactured using the device of the display device illustrated in FIG. 3, according to one or more exemplary embodiments.

Referring to FIG. 11, the organic light emitting device may include a display substrate 1101. The display substrate 1101 may include an insulating material having flexibility or an insulating material having rigidity. The display substrate 1101 may be transparent, semi-transparent or opaque.

A barrier layer 1102 may be disposed on the display substrate 1101. The barrier layer 1102 may cover the entire upper surface of the display substrate 1101. The barrier layer 1102 may include an inorganic layer and/or an organic layer.

A thin film transistor TFT may be disposed on the barrier layer 1102. A semiconductor activation layer 1103 may be disposed on the barrier layer 1102. A source region 1104 and a drain region 1105 may be formed in the semiconductor activation layer 1103 by doping impurities of N type or P type. A channel region 1106 may be formed between the source region 1104 and the drain region 1105 where impurities are not doped.

A gate insulating layer 1107 may be disposed on the semiconductor activation layer 1103. The gate insulating layer 1107 may include an inorganic layer such as silicon oxide, silicon nitride, and metal oxide. The gate insulating layer 1107 may have a structure of a single layer or a stack layer.

A gate electrode 1108 may be disposed in a corresponding region on the gate insulating layer 1107. The gate electrode 1108 may include a single layer or stack layer of at least one of Au, Ag, Cu, Ni, Pt, Pd, Al, Mo, Cr, etc. The gate electrode 1108 may include an alloy such as Al:Nd and Mo:W.

An interlayer insulating layer 1109 may be disposed on the gate electrode 1108. The interlayer insulating layer 1109 may include an inorganic layer such as silicon oxide and silicon nitride, and/or an organic layer.

A source electrode 1110 and a drain electrode 1111 may be disposed on the interlayer insulating layer 1109. Contact holes may be formed in the gate insulating layer 1107 and the interlayer insulating layer 1109 by selective removing portions of the gate insulating layer 1107 and the interlayer insulating layer 1109, and through contact holes, the source electrode 1110 may be electrically connected to the source region 1104 and the drain electrode 1111 may be electrically connected to the drain region 1105.

A protective layer 1112, which may be a passivation layer and/or a planarization layer, may be disposed on the source electrode 1110 and the drain electrode 1111. The protective layer 1112 may include an inorganic layer of silicon oxide and silicon nitride, and/or an organic layer of acryl, polyimide, and benzocyclobutene (BCB).

An organic light emitting device (OLED) may be disposed on the top portion of the TFT. The OLED may be disposed on the protective layer 1112. The OLED may include a first electrode 1113, an intermediate layer 1122, and a second electrode 1115.

The first electrode 1113 may be an anode and may include various conductive materials. The first electrode 1113 may be a transparent electrode or a reflective-type electrode. For example, when the first electrode 1113 is a transparent electrode, the first electrode 1113 may include a transparent conductive layer. When the first electrode 1113 is a reflective-type electrode, the first electrode 1113 may include a reflective layer and the transparent conductive layer disposed on the reflective layer.

A pixel defining layer 1114 may cover portions of the protective layer 1112 and the first electrode 1113. The pixel defining layer 1114 may define a light emitting region of respective sub-pixels by surrounding edges of the first electrode 1113. The first electrode 1113 may be patterned with respect to each sub-pixel. The pixel defining layer 1114 may include an organic layer and/or an inorganic layer. The pixel defining layer 1114 may be formed of a single layer or a stack layer.

An intermediate layer 1122 may be disposed on the first electrode 1113 in an region of the pixel defining layer 1114 exposed by etching. The intermediate layer 1122 may be disposed by the deposition process. The intermediate layer 1122 may be patterned with the deposition material deposited through pattern holes 321 of divided masks 320 manufactured by the mask extension-welding device 300 of FIG. 4.

The intermediate layer 1122 may include an organic emissive layer. The intermediate layer 1122 may also include, in addition to the organic emissive layer, at least one of a hole injection layer (HIL), a hole transport layer (HTL), an electron transport layer (ETL), and an electron injection layer (EIL). However, the exemplary embodiments are not limited thereto, and the intermediate layer 1122 may include the organic emissive layer and may further include various function layers.

The second electrode 1115 may include the intermediate layer 1122. The second electrode 1115 may be a cathode. The second electrode 1115 may include a transparent electrode and/or a reflective-type electrode. For example, when the second electrode 1115 is a transparent electrode, the second electrode 1115 may include a metal layer and a transparent conducting layer disposed on the metal layer. When the second electrode 1115 is a reflective-type electrode, the second electrode 1115 may include the metal layer.

According to one or more exemplary embodiments, each of the sub-pixels formed on the display substrate 1101 may be configure to generate light with red, green, blue, or white color. However, the exemplary embodiments are not limited thereto.

An encapsulation layer 1116 may be disposed on the top portion of the OLED. The encapsulation layer 1116 may protect the intermediate layer 1122 and other layers from humidity and/or oxygen of the outside. The encapsulation layer 1116 may include glass with rigidity, or a polymer resin or a film with flexibility. The encapsulation layer 1116 may have a structure in which at least one of each layer of organic layers 1117 and 1119, and an inorganic layer 1118 are alternately stacked on the OLED. For example, the encapsulation layer 1116 may have structure in which at least one of each layer of an organic layer 1117 and 1119, and an inorganic layer 1118 are alternately stacked.

Although certain exemplary embodiments and implementations have been described herein, other embodiments and modifications will be apparent from this description. Accordingly, the inventive concept is not limited to such embodiments, but rather to the broader is scope of the presented claims and various obvious modifications and equivalent arrangements.

What is claimed is:

1. A mask frame assembly manufactured via an extension-welding process on a stage, the mask frame assembly comprising:
   a mask frame disposed on the stage, the mask frame comprising a first frame and a second frame having a first length, and a third frame and a fourth frame having a second length, the second length being less than the first length; and
   a mask having respective ends welded and combined onto the first frame and the second frame,
   wherein the first frame and the second frame comprise a slot disposed toward the stage, and
   wherein the slot is formed throughout the first frame and the second frame along a length direction of the first frame and the second frame, so that entire portions of the first frame and the second frame are not in contact with the stage.

2. The mask frame assembly of claim 1, wherein a cross-section of the slot along the length direction of the first frame and the second frame has an arch shape.

3. The mask frame assembly of claim 1, the mask frame assembly further comprising protruding units extended along a width direction of the first frame and the second frame and disposed in the slot, wherein at least one of the protruding units is in contact with the stage.

4. The mask frame assembly of claim 3, wherein the at least one of the protruding units is arranged along a length direction of the first frame and the second frame.

5. The mask frame assembly of claim 3, wherein the at least one of the protruding units is in line-contact with the stage along the width direction of the first frame and the second frame.

6. The mask frame assembly of claim 1, the mask frame assembly further comprising protruding units formed along length and width directions of the first frame and the second frame and disposed in the slot, wherein at least one of the protruding units is in contact with the stage.

7. The mask frame assembly of claim 6, wherein the at least one of the protruding units is in point-contact with the stage.

8. The mask frame assembly of claim 6, wherein a cross-section of the at least one of the protruding units in width and length directions thereof has a shape of one selected from a group consisting of a circle, an ellipse, and a polygon.

* * * * *